United States Patent
Tsukagoshi

(12) 
(10) Patent No.: US 6,173,427 B1
(45) Date of Patent: Jan. 9, 2001

(54) IMMUNITY EVALUATION METHOD AND APPARATUS FOR ELECTRONIC CIRCUIT DEVICE AND LSI TESTER

(75) Inventor: Tsuneo Tsukagoshi, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/100,964

(22) Filed: Jun. 22, 1998

(30) Foreign Application Priority Data

Jun. 20, 1997 (JP) .................................................. 9-164689

(51) Int. Cl.[7] .................................................. G01R 31/28
(52) U.S. Cl. .................... 714/724; 714/817; 342/372
(58) Field of Search .................... 342/372, 170, 342/168, 173; 714/724, 725, 733, 734, 736, 738, 744, 745, 718, 719, 721, 817, 811; 375/227, 224, 254, 278, 279

(56) References Cited

U.S. PATENT DOCUMENTS 4,939,446 * 7/1990 Rogers .................................... 324/72
4,947,105 * 8/1990 Unger et al. ............................ 324/765
5,302,960 * 4/1994 Boers ..................................... 342/372

FOREIGN PATENT DOCUMENTS 4-95786  3/1992 (JP) .

* cited by examiner

Primary Examiner—Christine T. Tu
(74) Attorney, Agent, or Firm—Foley & Lardner

(57) ABSTRACT

An apparatus and a method for checking that an electronic circuit device or an electronic circuit component such as an LSI operates normally or abnormally by applying an input pattern to the electronic circuit device or the electronic circuit component together with electromagnetic noises before comparing an obtained output pattern with an expected pattern so as to judge whether or not the patterns match in order to evaluate immunity to electromagnetic noises (conductive or radiation noises).

12 Claims, 17 Drawing Sheets

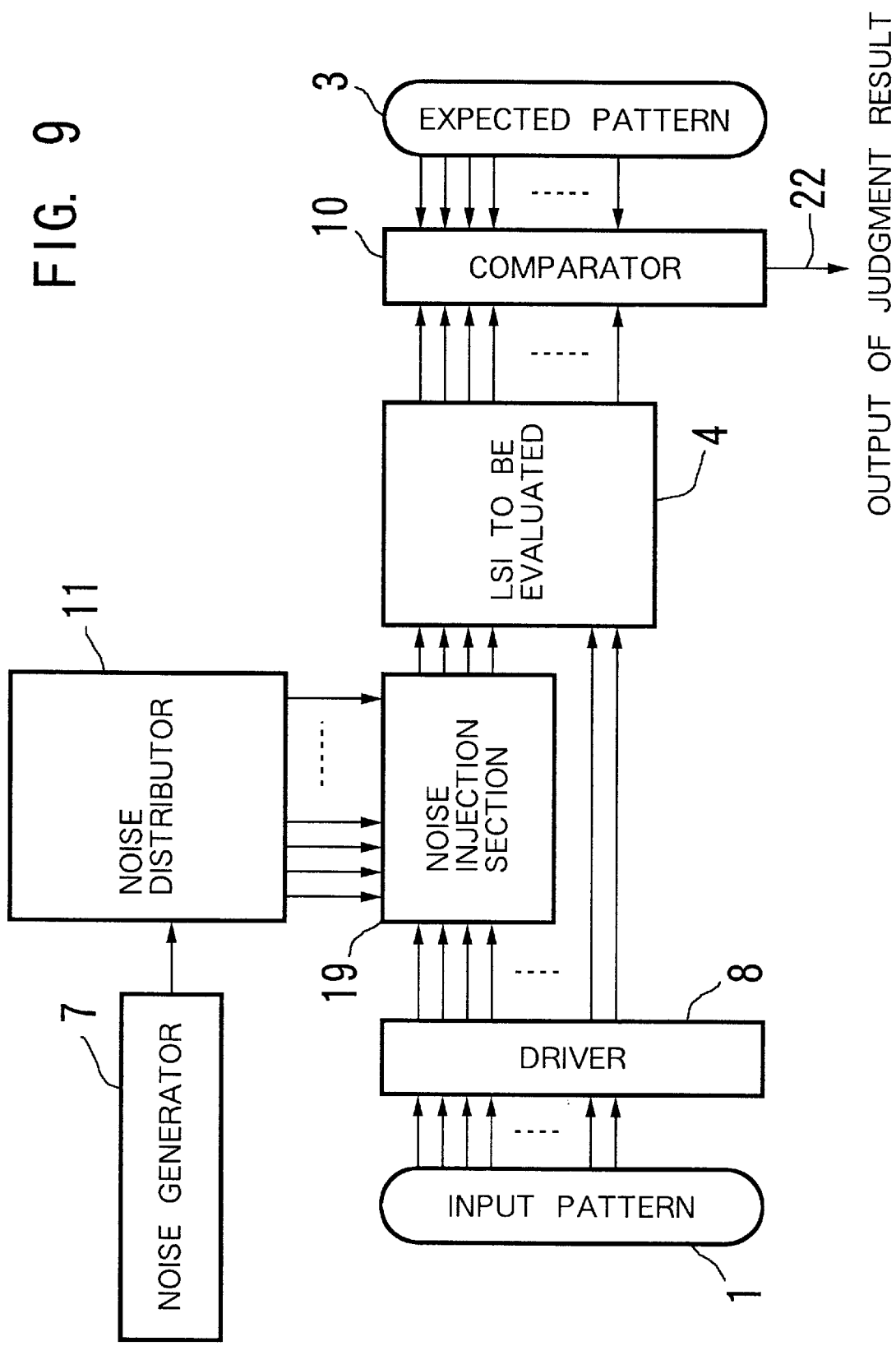

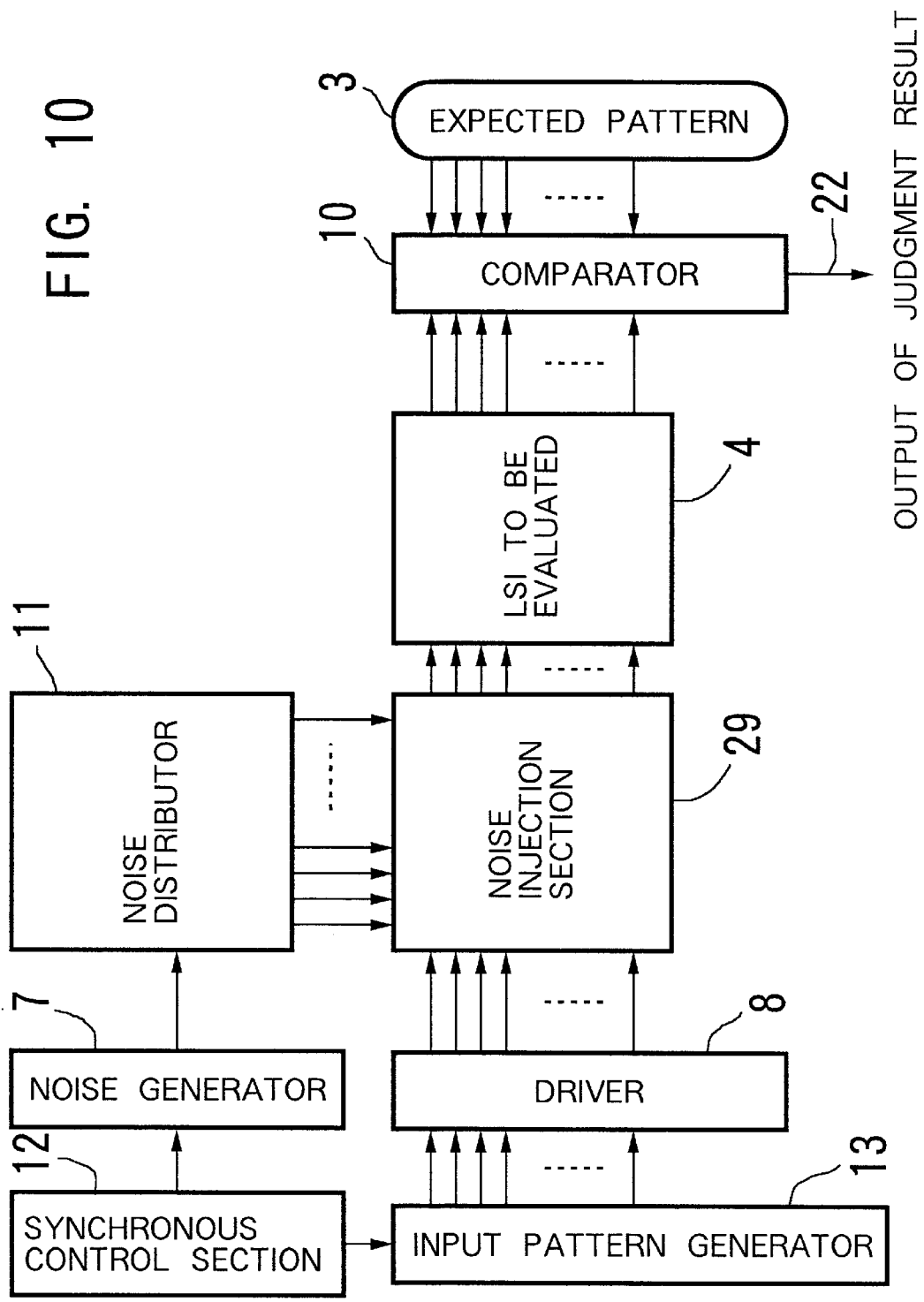

IMMUNITY EVALUATION METHOD AND APPARATUS FOR ELECTRONIC CIRCUIT DEVICE AND LSI TESTER

BACKGROUND OF THE INVENTION

1. Field of the Invention

The present invention relates to a method and an apparatus for evaluating immunity characteristics of an electronic circuit device or an electronic circuit component, such as an LSI or a memory, to electromagnetic noises such as conductive noise and radiation noise and to an LSI tester having those evaluation functions.

2. Description of the Prior Art

Electromagnetic noises received by electronic equipment or electronic circuit devices are classified into radioactive noises caused by a radiation field in the air emitted from radiobroadcasting equipment, televisions, and mobile telephones and conductive noises conducting through power lines, signal lines or ground lines to be connected to electronic equipment or circuit devices. Recently, however, there has been occurred a problem that these electromagnetic noises may cause malfunction of digital equipment having LSIs or memories.

Therefore, conventionally there has been known an immunity evaluation device for evaluating resistance to noises of electronic equipment, or printed circuit board mainly evaluating behaviors of malfunction of the digital equipment by giving an electromagnetic noise to the equipment from its outside. While this method is suitable for checking a degree of intensity of the noise which causes the malfunction of the digital equipment, it is difficult to specify which circuit device or printed circuit board has malfunctioned in the equipment. To improve noise immunity which is a performance of resistance to noises of digital equipment, however, it is important to evaluate noise immunity of a single circuit device such as an LSI and to specify a cause of malfunction of the digital equipment.

On the other hand, as a device for use in evaluating an LSI function, conventionally an LSI tester has been used in general. The LSI tester is used for checking an operation at manufacturing an LSI by previously obtaining input-output characteristics assumed based on design uses in order to evaluate whether or not the manufactured LSI satisfies the characteristics. A principle of the conventional LSI tester is shown in FIG. 1.

In this LSI tester, as shown in FIG. 1, an input pattern 1 which is an input signal group required for a normal operation is applied to each input terminal of an LSI 4 which is to be evaluated and then an output pattern 2 which is an output signal group obtained by an output terminal as a result is compared with an expected pattern 3 which is an output group which is previously expected at a normal operation, by which it has been judged that the LSI is normal if all the patterns match and that it is abnormal if any one of the parts of the pattern does not match the other one. The abnormal state shows that the target LSI is in error because of any fault of LSI caused in its manufacturing process. This LSI tester is characterized in that it can evaluate an LSI singly. The LSI tester, however, is intended for judgment of an error due to any fault of LSI and not for evaluating noise immunity, which shows a maximum noise level that causes malfunction in an LSI.

Generally speaking, there are two types of malfunction; one is caused by an application of conductive noises which had been entered through wire patterns to the LSI and the other is caused by radiation noises in the air which the LSI has directly received. When the LSI immunity is evaluated, these two types of malfunction must be evaluated; the former is an immunity evaluation to the conductive noises and the latter is an immunity evaluation to the radiation noises.

As a test equipment which can be used for the immunity evaluation of electronic circuits to the conductive noises, there is known a test equipment disclosed in Japanese Non-examined Patent Publication No. 4-95786, for example. It is an immunity evaluation equipment for an electronic circuit comprising a plurality of components mounted on a printed circuit board. This test equipment is characterized in that an LSI can be evaluated while is mounted on the board together with other components.

As shown in FIG. 2, the conventional test equipment comprises an electromagnetic radiator 16, a rod antenna 17, and an electromagnetic shielding box 23. A circuit component 25 to be evaluated is mounted on a circuit board 18. When electromagnetic waves are radiated from the electromagnetic radiator 16 with the rod antenna 17 in contact with a terminal 20 of the circuit component 25 to be evaluated, the magnetic waves are received by the rod antenna 17, and then noise current induced by the rod antenna 17 is applied to the circuit component 25 on the circuit board 18 via the terminal 20. By confirming that the circuit does not malfunction at this point, the noise immunity of the circuit component 25 can be evaluated. By using this equipment, it is possible to apply an electromagnetic noise selectively only to the terminal 20 of the circuit component 25 to be evaluated, and to evaluate selectively and accurately a circuit which is not resistant to radioation noises under actual use conditions since malfunction easily occurs in circuits having high input impedance.

The conventional immunity evaluation method in the above, however, is intended for evaluating noise immunity of an electronic circuit board on which various LSIs and circuit components are mounted, and not necessarily for evaluating noise immunity of a single electronic circuit component to which a noise is applied. Particularly in a digital circuit, an operation is normally progressed by an applied program, and in some cases the operation is put in an off state on the program even if the circuit is physically connected depending on an execution part of the program. In other words, even if it is connected in hardware, it may be disconnected in software. If an electromagnetic noise is applied in this state, the entire circuit does not malfunction. In other words, immunity significantly depends upon software operation modes, on whether or not an applied electromagnetic noise causes malfunction of the entire circuit.

In addition, an electric field in the electromagnetic shielding box is not always uniform and therefore the result of the evaluation may be significantly different from that of an immunity evaluation method with an antenna which is applied in a radio shielding room in order to evaluate noise immunity by irradiation with plane waves.

Furthermore, generally it is not easy to identify the operation mode while an actual electronic circuit board is in operation.

In the conventional immunity evaluation method in which an electronic circuit board is used, a single electronic circuit component such as an LSI cannot be sufficiently evaluated on its immunity.

On the other hand, as to a general method of evaluating characteristics of noise immunity to radioactive noises, as shown in FIG. 3, an electronic circuit component or an electronic circuit board 21 to be evaluated is placed in an operating state in an electromagnetic echoic chamber 19, and then the electronic circuit component or the electronic circuit board 21 to be evaluated is exposed to electromagnetic waves W from an antenna 23 put in a position spaced a given distance, for example, 10 m away from the evaluation target in order to check the presence or absence of malfunction of the evaluation target. According to this method, each component can be exposed to electromagnetic waves in a plane wave mode, that is, a TEM mode so as to be evaluated under uniform conditions, and therefore it is a suitable method for an evaluation of a technical standard, by which the method is the most popular for an immunity test of a product. In an evaluation with this method, however, it is not easy to specify which circuit component has malfunctioned at an occurrence of an erroneous operation, and therefore it is not suitable for an immunity evaluation of a single circuit component.

Supposing that it is attempted that an electromagnetic noise is applied in an antenna method with an LSI tester which allows a single LSI to be evaluated as a circuit component, it is necessary to place the LSI tester itself in a radio shielding room. The LSI tester, however, which is generally large-sized, cannot be easily placed in the electromagnetic echoic chamber. Even if it can be placed in the electromagnetic echoic chamber, the LSI tester itself is caused to receive electromagnetic noises, by which the noise immunity of the target LSI may not be evaluated correctly.

SUMMARY OF THE INVENTION

It is a first object of the present invention to provide a method and an apparatus for evaluating immunity characteristics of an electronic circuit device or an electronic circuit component such as an LSI to electromagnetic noises, particularly to conductive noises and radiation noises.

It is a second object of the present invention to provide an LSI tester having a function of evaluating noise immunity characteristics of an LSI to electromagnetic noises.

To achieve the first object, an immunity evaluation method of the present invention is used to evaluate immunity to noises by generating an input pattern for checking an operation of an electronic circuit component to be evaluated and an expected pattern anticipated to be output for the input pattern if the operation of the circuit component is normal, entering the input pattern to the electronic circuit component with an electromagnetic noise, and comparing an output pattern obtained from the electronic circuit component with the expected pattern to check the operation of the electronic circuit component to the electromagnetic noise.

In the immunity evaluation method of the present invention, noise immunity of an electronic circuit component is assumed to be the maximum value of an electromagnetic level within a range of not causing any malfunction of the electronic circuit component to be evaluated when a level of an electromagnetic noise supplied for the evaluation is increased gradually or stepwise.

To achieve the first object in the same manner, an immunity evaluation apparatus of the present invention comprises a pattern generator for generating an input pattern used to check an operation of an electronic circuit component to be evaluated and an expected pattern anticipated to be output for the input pattern if the operation of the circuit component is normal, a driver for entering the input pattern to the electronic circuit component to be evaluated via a signal line, a noise generator for generating a noise for immunity evaluation, a noise application section for applying the noise generated by the noise generator to the electronic circuit component, and a comparison means for comparing an output pattern obtained from the electronic circuit component with the expected pattern so as to evaluate immunity to the noise based on the result of the comparison.

According to the method and the apparatus of the present invention, it is possible to easily evaluate noise immunity characteristics of an electronic circuit component to an electromagnetic noise for a single circuit component.

According to a first aspect of the present invention, an immunity evaluation apparatus to a conductive noise comprises a pattern generator for generating an input pattern used to check an operation of an electronic circuit component to be evaluated and an expected pattern anticipated to be output for the input pattern if the operation of the circuit component is normal, a driver for entering the input pattern to the electronic circuit component to be evaluated via a signal line, a noise generator for generating a noise for immunity evaluation, a noise injection section for injecting the noise generated by the noise generator to the signal line between the driver and the electronic circuit component, and a comparison means for comparing an output pattern obtained from the electronic circuit component with the expected pattern so as to evaluate immunity to the noise based on the result of the comparison. In the noise injection section, the noise can be applied to any of a predetermined input terminal of the electronic circuit component and a plurality of input terminals.

According to a second aspect of the present invention, an immunity evaluation apparatus to a radiation noise comprises a pattern generator for generating an input pattern used to check an operation of an electronic circuit component to be evaluated and an expected pattern anticipated to be output for the input pattern if the operation of the circuit component is normal, a driver for entering the input pattern to the electronic circuit component to be evaluated via a signal line, a noise generator for generating a noise for immunity evaluation, a noise radiating section for radiating noise generated by the noise generator to the electronic circuit component as a radiation noise, and a comparison means for comparing an output pattern obtained from the electronic circuit component with the expected pattern so as to evaluate immunity to the noise based on the result of the comparison. The noise radiating section is a TEM cell which generates electromagnetic waves in the TEM mode, and the electronic circuit component to be evaluated is placed in the TEM cell. The electromagnetic field is generated only in the TEM cell with the radiation, and therefore only the electronic circuit component to be evaluated can be efficiently irradiated with a radiation noise.

In the first and second aspects of the present invention set forth in the above, it is preferable to arrange a synchronous control section for a synchronization between a timing at which the pattern generator generates the input pattern and a timing at which the noise generator generates the noise. This synchronous control section is effective to obtain a more reliable immunity evaluation.

To achieve the second object, an LSI tester of the present invention is configured so as to enter an input pattern used to check an operation of an electronic circuit component to an LSI with applying an electromagnetic noise and to compare an output pattern obtained from the LSI with an expected pattern anticipated to be output to the input pattern if the LSI normally operates. This configuration makes it possible to perform the LSI function evaluation and the immunity evaluation in the same LSI tester.

BRIEF DESCRIPTION OF THE DRAWINGS

FIG. 9 is a block diagram illustrating a configuration of an immunity evaluation apparatus of a second embodiment of the present invention;

FIG. 10 is a block diagram illustrating a configuration of an immunity evaluation apparatus of a third embodiment of the present invention;

DETAILED DESCRIPTION OF THE PREFERRED EMBODIMENTS

Figure 1:
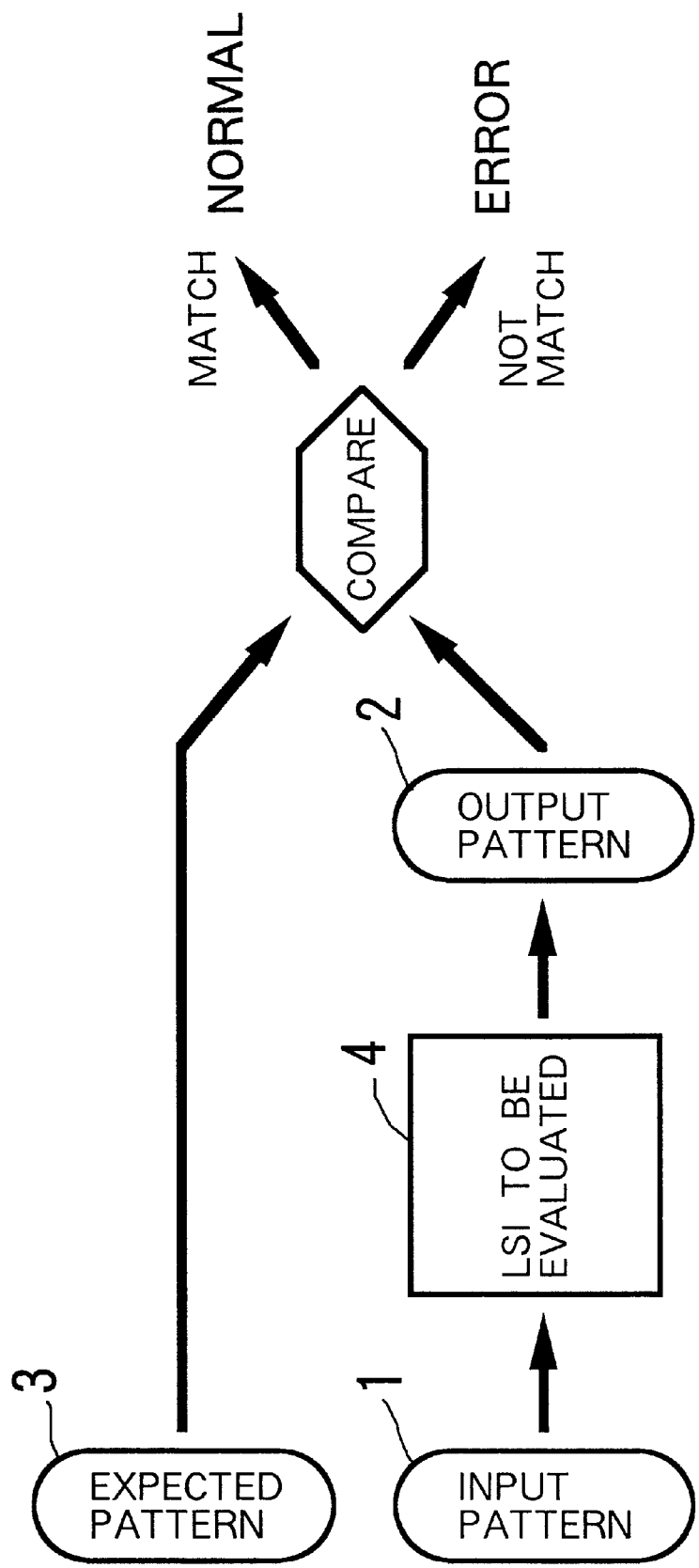
FIG. 1 is a diagram illustrating an operation principle of a conventional LSI tester.
Figure 2:
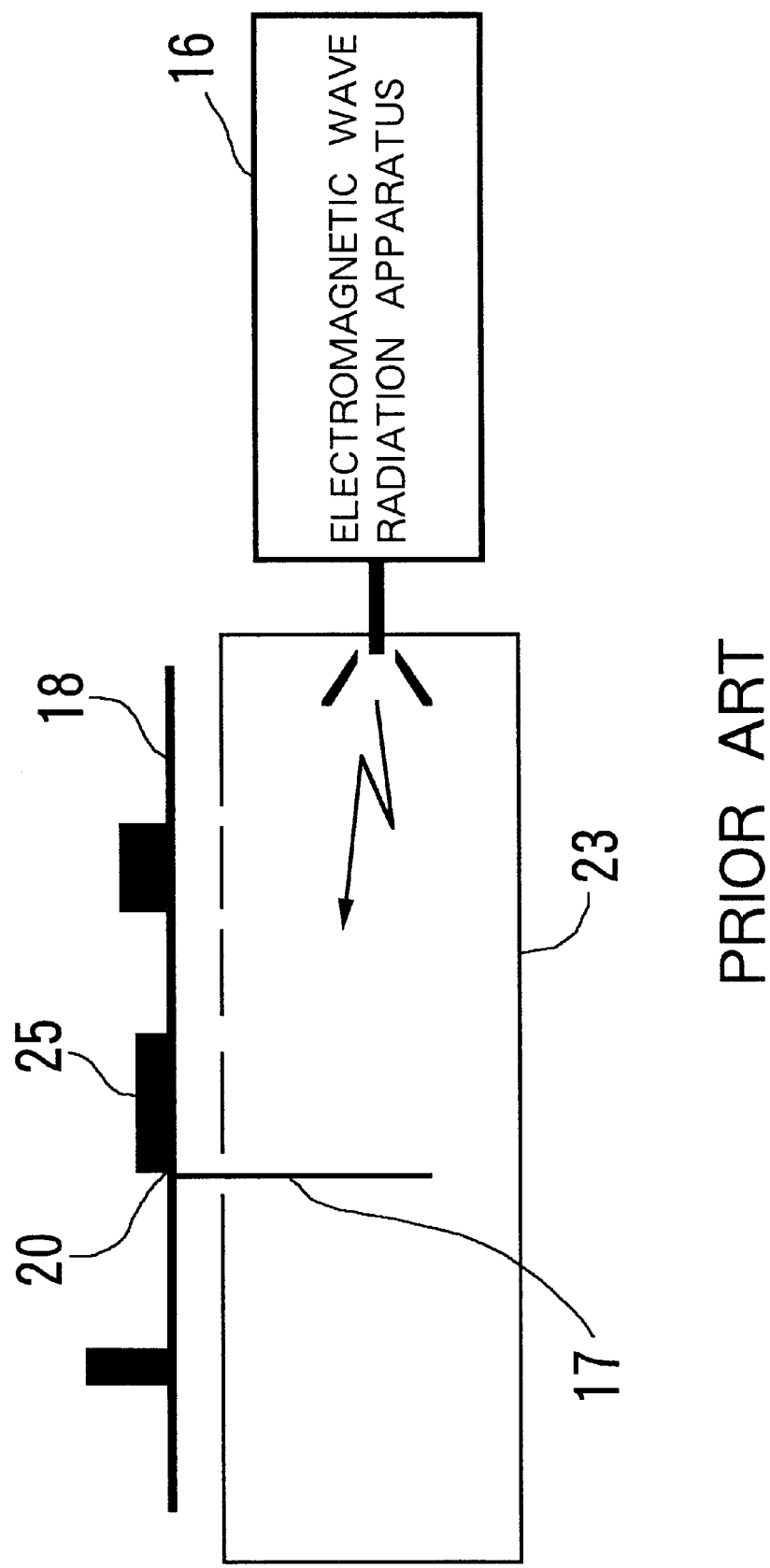
FIG. 2 is a schematic diagram of a conventional immunity evaluation apparatus.
Figure 3:
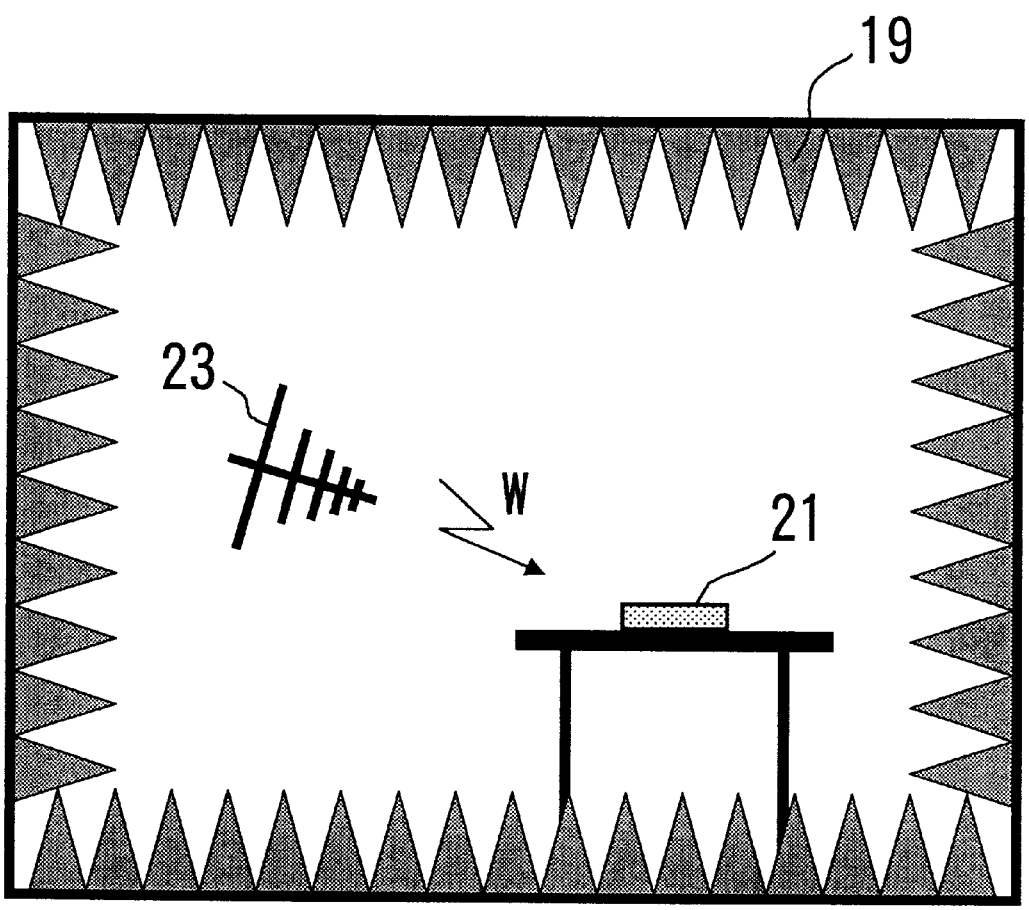
FIG. 3 is a schematic diagram of a conventional immunity evaluation apparatus to a radiation noise.
Figure 4:
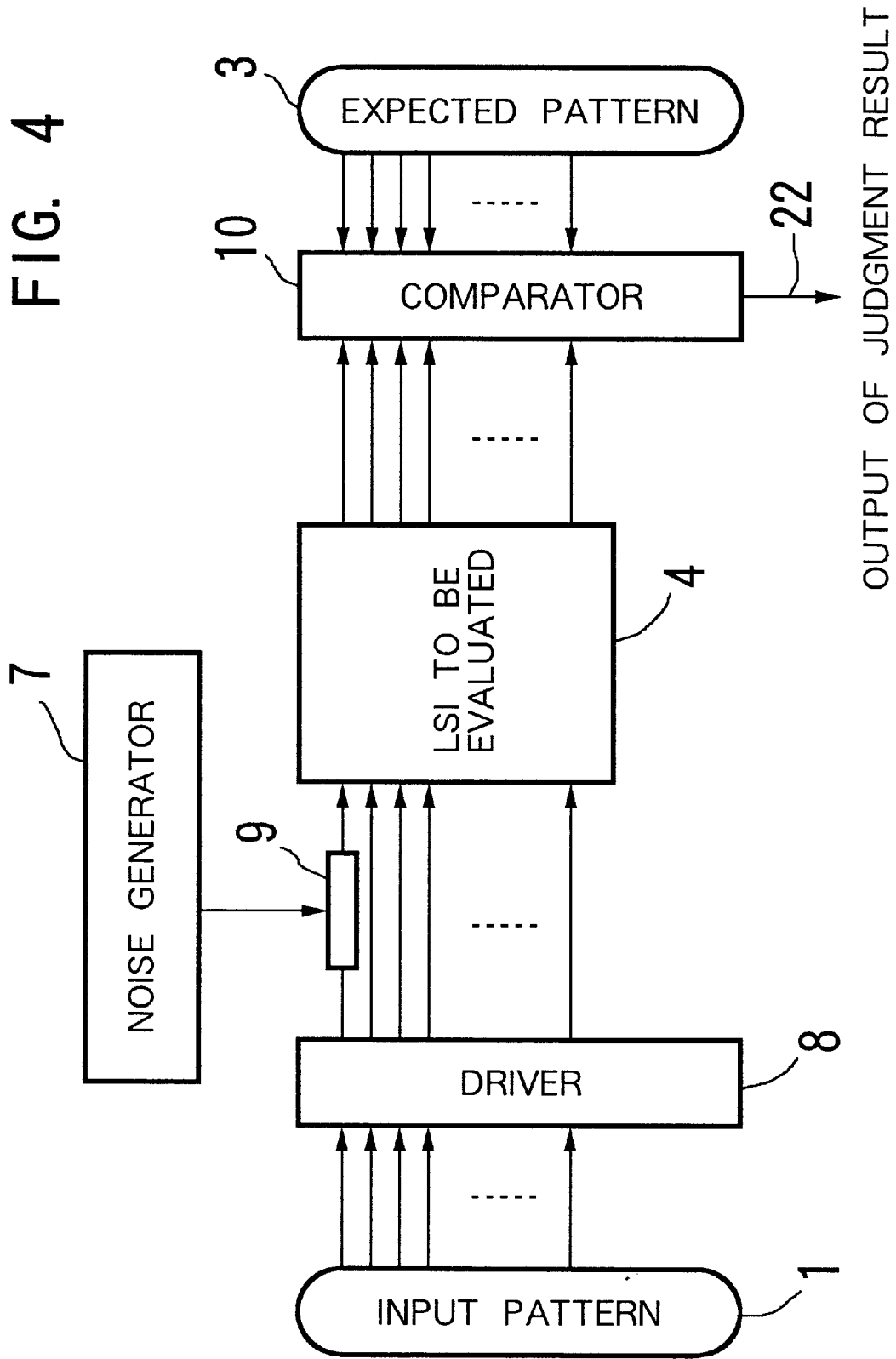
FIG. 4 is a block diagram illustrating a configuration of an immunity evaluation apparatus according to a first embodiment of the present invention.

Referring to FIG. 4, there is shown a block diagram illustrating a configuration of an LSI immunity evaluation apparatus to conductive noises of a first embodiment of the present invention.

The immunity evaluation apparatus of this embodiment is intended for evaluating individual noise immunity of respective input terminals of the LSI, which is an example of an electronic circuit device. Noises used here are conductive noises applied via input signal lines. As noises actually received by the LSI mounted on a printed circuit board incorporated into electronic equipment, there are radioactive noises inside and outside the electronic equipment, crosstalk noises from other wiring patterns, and ESD noises. Most of these noises are induced by wiring patterns of signal lines to be entered into the LSI as conductive noises.

Referring to FIG. 4, the immunity evaluation apparatus of this embodiment comprises a driver 8, a noise generator 7, a comparator 10, and a noise injection section 9. The noise generator 7 generates noises for immunity evaluation. There are a damped oscillation waveform in FIG. 7A, a electrostatic radiation waveform in FIG. 7B, and a trapezoidal waveform in FIG. 7C as noise samples, though other waveforms can be applied.

The comparator 10 compares an output pattern output from an output terminal of an LSI 4 to be evaluated with an expected pattern 3 prepared in advance and outputs the comparison result as a judgment result output 22. The noise injection section 9 applies a noise generated by the noise generator 7 to an input terminal selected out of the input terminals of the LSI 4 to be evaluated.

Next, referring to FIG. 5, an immunity evaluation method will be explained in the noise immunity evaluation apparatus of this embodiment.

Figure 8A:
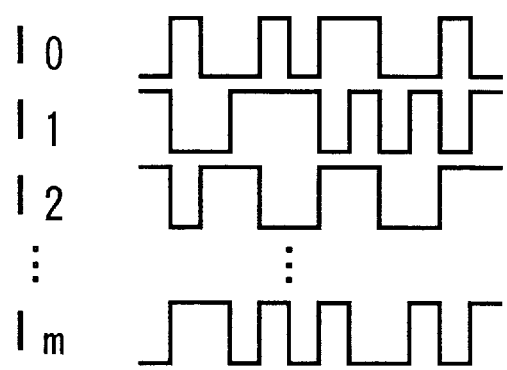
FIGS. 8A, 8B, 8C, and 8D are waveform charts of input patterns, output patterns, expected patterns, and input patterns with a noise applied for use in immunity evaluation in the present invention.
Figure 8B:
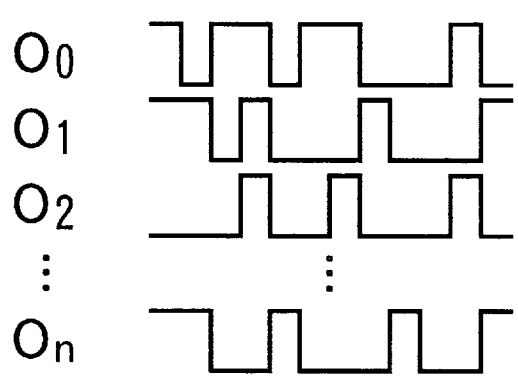
Figure 8C:
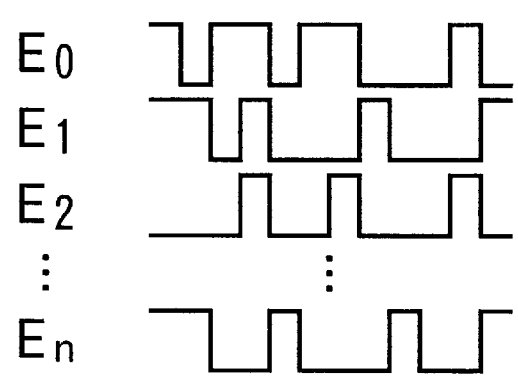

FIGS. 8A, 8B, and 8C show examples of input patterns 1, output patterns 2, and expected patterns 3 for n input terminals and output terminals of the LSI.

Figure 7A:
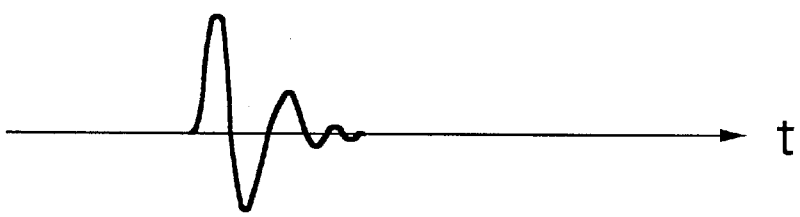
FIGS. 7A, 7B and 7C are waveform charts of noise patterns for use in immunity evaluation in the present invention.
Figure 7B:
Figure 7C:
Figure 8D:
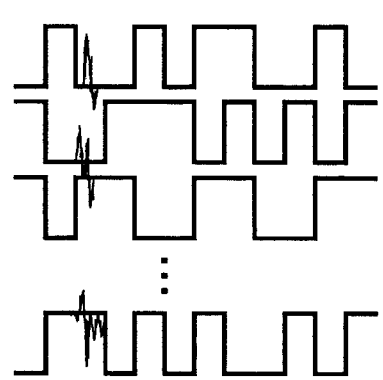

In the immunity evaluation apparatus of this embodiment, the input patterns 1 are applied to the LSI 4 to be evaluated via the driver 8. At this point, noise patterns 5 in FIGS. 7A to 7C are applied to the LSI 4 via the noise injection section 9, which is arranged on a signal line connected to an input terminal to be evaluated for immunity previously selected out of the input terminals of the LSI 4. FIG. 8D shows a sample of input patterns into which the noises have be injected.

Afterward, the comparator 10 compares the output patterns 2 obtained from the output terminals of the LSI 4 to be evaluated with the expected patterns 3. If both patterns completely match as a comparison result, it is judged that the LSI normally operates. If any of the patterns does not match, it is judged that the LSI malfunctions. The judgment result is output as a judgment result output 22. This operation sequence is assumed to be a cycle of a malfunction judgment. The noise patterns 5 are determined by a selected signal line used for noise injection and a noise voltage.

Figure 6:
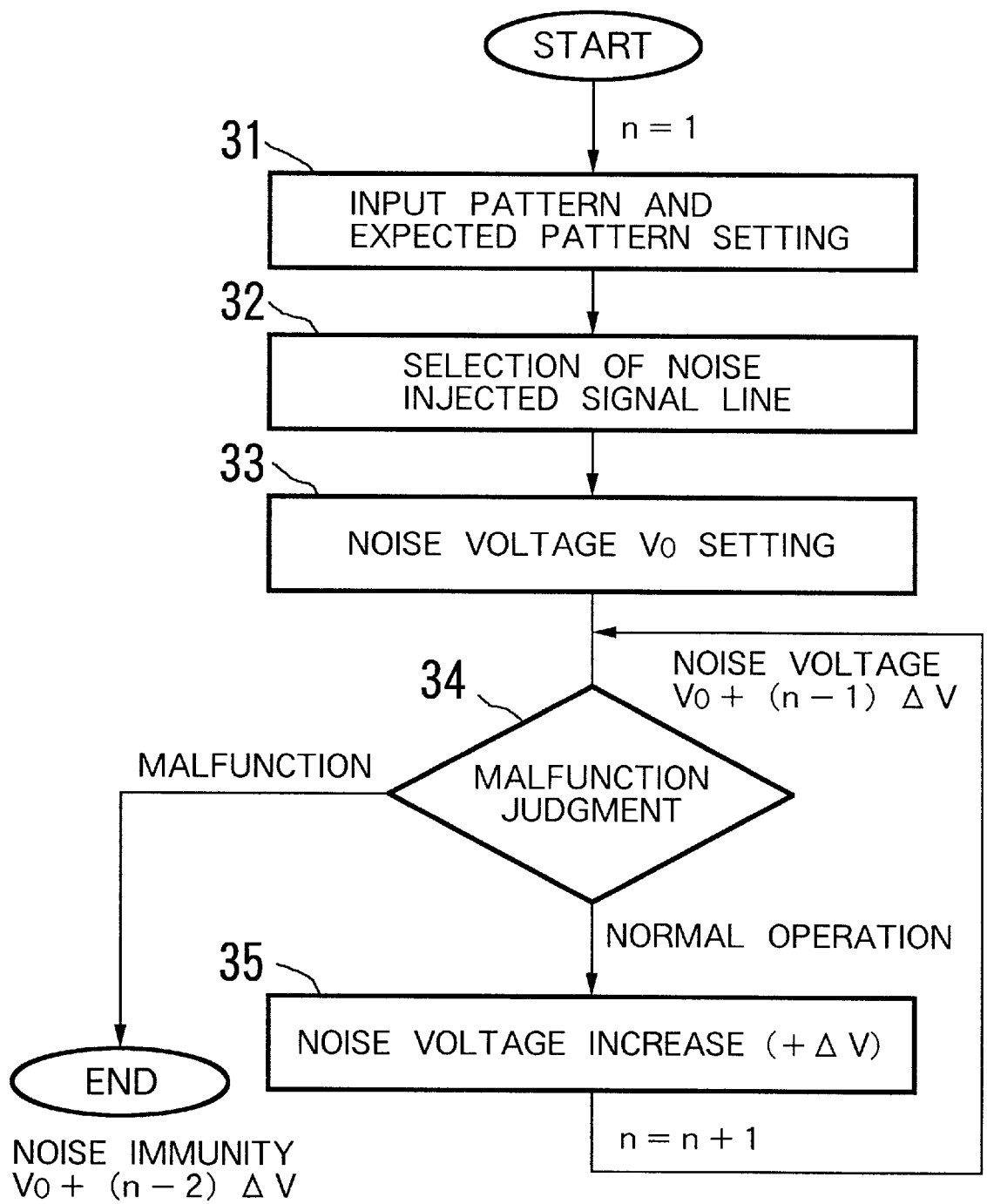
FIG. 6 is a flowchart illustrating an algorism of an immunity evaluation made by the immunity evaluation apparatus shown in FIG. 4.

FIG. 6 shows a flowchart for an explanation of the noise immunity evaluation method.

First, an input pattern and a correct (expected) pattern 3 are set (Step 31). Then, the normal input pattern 1 is applied via the driver 8 and an output pattern 2 from the LSI 4 to be evaluated is compared with the expected pattern 3 by the comparator 10, by which it is confirmed that the LSI 4 normally operates if both patterns completely match. Next, a sufficiently low noise voltage $V_0$ (volts) is generated in the noise generator 7 simultaneously with the generation of the input pattern 1, and the noise voltage $V_0$ is injected into a predetermined (Step 32) signal line via the noise injection section 9 (Step 33). As a result, the LSI 4 receives an input signal of the input pattern 1 with the noise convoluted only in the set signal line. Whether or not the LSI malfunctions in this state is judged by using the comparator 10 in the same manner (Step 34). If the output of judgment result 22 indicates the normal operation, another operation judgment is made subsequently by applying a noise voltage ($\Delta V + V_0$) which has been increased by $\Delta V$ to the LSI 4 simultaneously with the input pattern 1 in the same manner (Step 35). This operation is repeated, and if malfunction occurs at an application of a noise voltage of $(n-1)\times\Delta V+V_0$ in the nth cycle (Step 34), $(n-2)\times\Delta V+V_0$ is assumed to be noise immunity of this input terminal and then the immunity evaluation is terminated.

In this embodiment, it is required to generate a noise voltage simultaneously with the generation of an input pattern. The simultaneous application of the input pattern and the noise, however, is not easy in this configuration only. Accordingly, by setting repeated application of the input pattern and applying the noise arbitrarily in the middle of the repetition, it is easier to take timing, by which the immunity evaluation can be readily performed.

FIG. 9 illustrates a block diagram of an immunity evaluation apparatus to conductive noises of a second embodiment of the present invention, wherein the same reference numerals as for FIG. 4 designate corresponding components.

The immunity evaluation apparatus of this embodiment differs from the immunity evaluation apparatus of the first embodiment shown in FIG. 4 in that a noise injection section 19 is connected to signal lines except two signal lines so that a noise can be injected into a plurality of signal lines (except two signal lines in the shown example) while only one noise generator 7 is connected and that a noise distributor 11 is added. The noise distributor 11 distributes a noise generated by the noise generator 7 to a plurality of noises.

The noise injection section 19 is intended for injecting noises individually distributed by the noise distributor 11 to respective input signal lines, and it can be considered as a set of the noise injection sections 9 used in the first embodiment shown in FIG. 4.

It is the same as the immunity evaluation apparatus of the first embodiment in FIG. 4 in that whether or not the LSI 4 malfunctions is judged by a comparison between the output pattern 2 (FIG. 8B) and the expected pattern (FIG. 8C) of the LSI 4 and that noise immunity is evaluated by increasing a noise voltage gradually. In the second embodiment, however, noises are injected into a plurality of signal lines, by which it is not clear which signal line is a direct cause of the malfunction as described above, and therefore it should be considered as noise immunity to the noise pattern 5 applied here. In other words, it is required to check it with a result evaluated for each signal line for judgment.

Referring to FIG. 10, there is shown a block diagram of an immunity evaluation apparatus to conductive noises of a third embodiment of the present invention, wherein the same reference numerals as for FIG. 9 designate corresponding components.

The immunity evaluation apparatus of this embodiment differs from the immunity evaluation apparatus of the second embodiment in FIG. 9 in that a synchronous control section 12 is arranged in order to achieve more accurate timing of noise injection. Particularly when a short pulse waveform is applied as a noise pattern, injection timing cannot be successfully taken in some cases in the method of a noise injection at arbitrary timing while applying an input pattern repeatedly as set forth in the above. Accordingly, the synchronous control section 12 is arranged as its countermeasure.

The synchronous control section 12 is connected to an input pattern generator 13 and a noise generator 7, by which an input pattern 1 and a noise pattern 5 can be generated at an arbitrary timing in synchronization with each other. Other parts of the configuration and immunity evaluation method are the same as for the immunity evaluation apparatus shown in FIG. 9.

Figure 11:
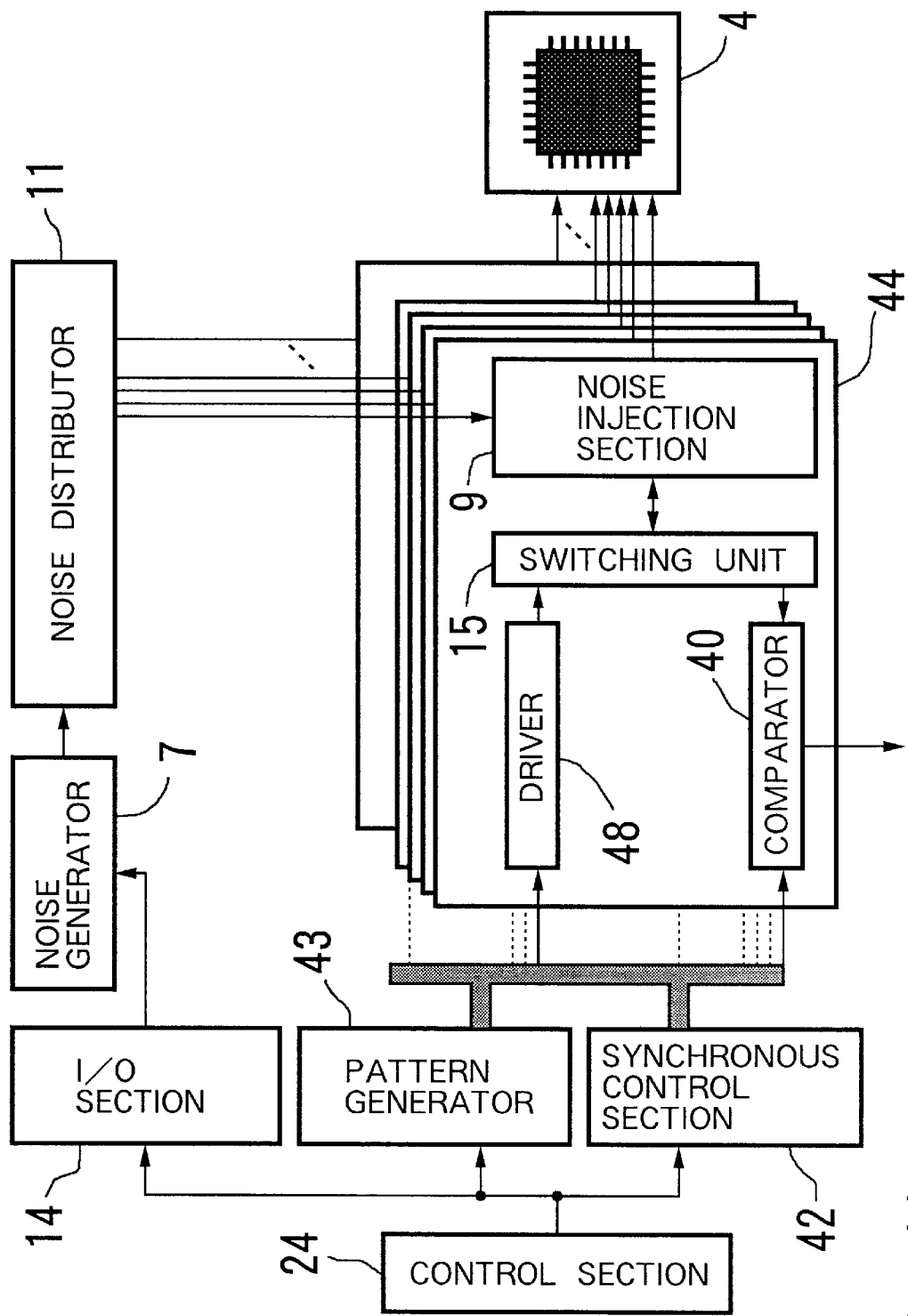
FIG. 11 is a block diagram illustrating a configuration of an LSI tester of a fourth embodiment of the present invention.

Referring to FIG. 11, there is shown a block diagram illustrating a configuration of an LSI tester of a fourth embodiment of the present invention intended for immunity evaluation to conductive noises. In this embodiment, the same reference numerals as for FIGS. 4 and 10 designate corresponding components.

The LSI tester of this embodiment comprises a control section 24, an I/O section 14, a pattern generator 43, a synchronous control section 42, a noise generator 7, a noise distributor 11, and evaluation blocks 44 of the same number of the LSIs 4 to be evaluated.

The pattern generator 43 generates input patterns 1 and expected patterns 3, outputs the input patterns 1 to the driver 48, and outputs the expected patterns 3 to the comparator 40.

The synchronous control section 42 controls the timing at which the input patterns generated by the pattern generator 43 are transmitted to the evaluation blocks 44 and the timing at which noises are injected. The noise injection timing is transmitted to the noise generator 7 via the I/O section 14.

The noise generator 7 may be a signal generator which can generate pulse waves and an arbitrary waveform generator which can regenerate noise waveforms sampled on an actual circuit board. By using the arbitrary waveform generator to sample noises generated in an actual electronic circuit board and to apply the regenerated waveform, ESD noises or the like can be simulated in an environment similar to the actual electronic circuit board.

Each evaluation block 44 comprises a driver 48, a comparator 40, a switching unit 15, and a noise injection section 9.

The driver 48 is a function for a terminal independently extracted from the functions of the driver 8 in FIG. 10, and its operation is the same as for the driver 8.

The comparator 40 is a function for a terminal independently extracted from the functions of the comparator 10 in FIG. 10, and its operation is the same as for the comparator 10.

The switching unit 15 connects the driver 48 to the noise injection section 9 if the terminal connected to the LSI 4 functions as an input terminal and connects an output from the LSI 4 to the comparator 40 via the noise injection section 9.

The switching unit 15 is incorporated so as to cope with some LSI 4 terminals for both of input and output, so that they can be temporally switched between input and output. The noise injection section 9 is required to be put between the switching unit 15 and the LSI 4 to be evaluated. It is because, if it is put between the driver 48 and the switching unit 15, the switching unit 15 may malfunction due to the injected noise and because if a noise waveform is passed through the switching unit 15 it may be distorted. In addition, if the noise injection section 9 is placed between the switching, unit 15 and the LSI 4, it is required to be used in synchronization with the switching unit 15 so that noises are injected when the switching unit 15 is set to an input mode.

Subsequently, an operation of this embodiment will be described below.

An operation of a normal LSI tester is explained first.

In the pattern generator 43, an input pattern 1 and an expected pattern 3 are generated. The input pattern 1 is applied to the LSI 4 via the driver 48, the switching unit 15, and the noise injection section 9. At this point, any noise is generated in the noise generator 7, and therefore no noise is injected into the input pattern 1 in the noise injection section 9. If the connected terminal functions as an output terminal, an output pattern from the LSI 4 is entered into the comparator 40 via the noise injection section 9 and the switching unit 15. Then, the comparator 40 compares the output pattern with the expected pattern 3 generated by the pattern generator 43 to evaluate the function.

Next, an operation of immunity evaluation is explained.

In the immunity evaluation, the noise generator 7 generates noises at the noise injection timing transmitted by the synchronous control section 42 via the I/O section 14 in addition to the operation of the normal LSI tester set forth in the above. The generated noises are distributed to the noise injection section 9 via the noise distribution section 11 and then applied to the input pattern 1 applied from the switching unit 15 to the LSI 4. Afterward, the output pattern is compared with the expected pattern 3 in the same method as for the normal LSI operation.

The noise immunity is evaluated by increasing an injected noise level gradually in the same method as one shown in the flowchart in FIG. 6.

The components described in the first to fourth embodiments for the immunity evaluation to conductive noises do not correspond to actual immunity evaluation apparatuses and a circuit configuration of an actual LSI tester individually, but respective components may be actualized in software.

Furthermore in the first to fourth embodiments in the above, how to know the noise immunity level is explained in the LSI noise immunity evaluation methods, and these methods can be applied to a test method of judging whether or not an LSI has a certain noise immunity level.

Figure 12:
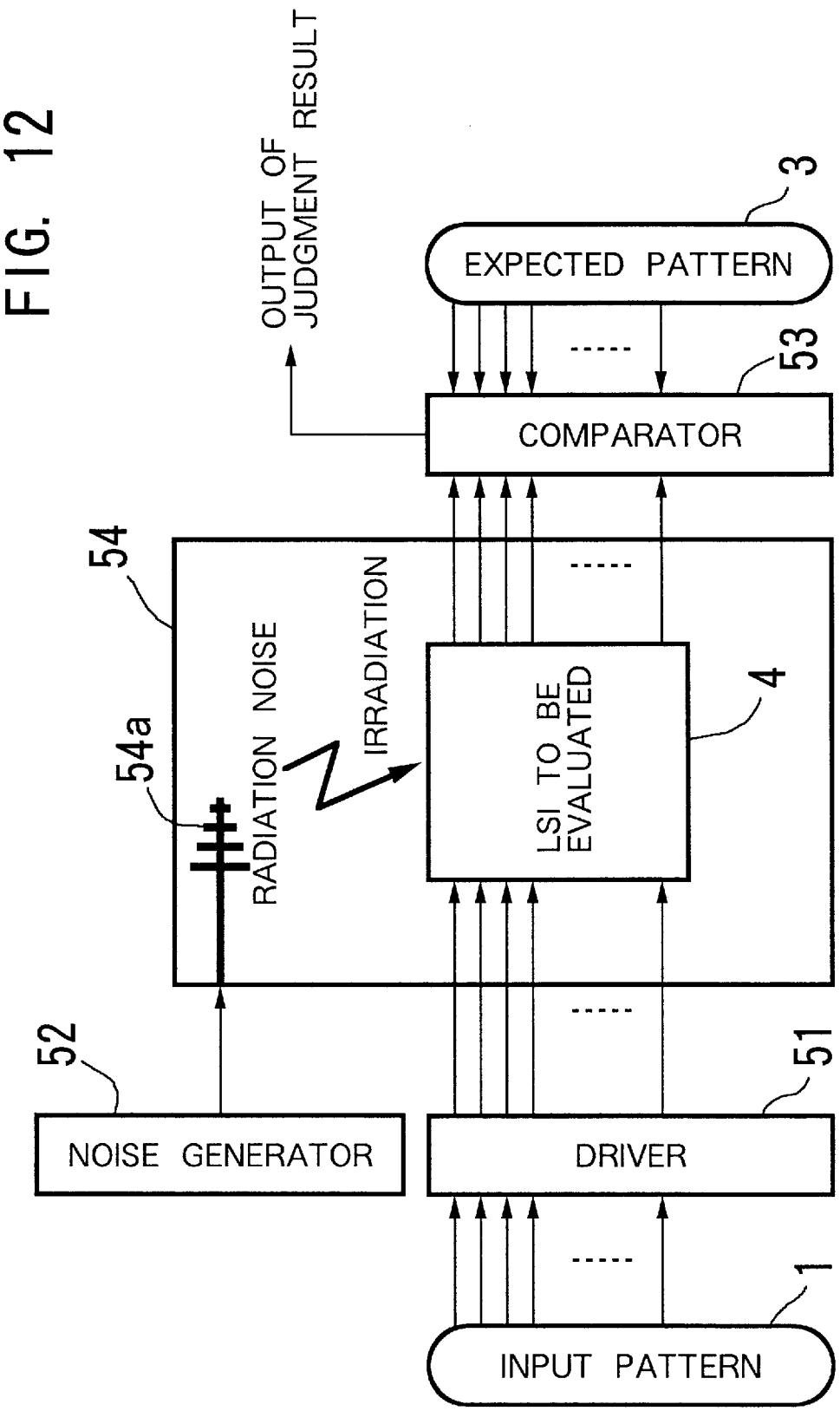
FIG. 12 is a block diagram illustrating a configuration of an immunity evaluation apparatus of a fifth embodiment of the present invention.

Referring to FIG. 12, there is shown a block diagram illustrating a configuration of an LSI immunity evaluation apparatus to radiation noises of a fifth embodiment of the present invention.

The immunity evaluation apparatus of this embodiment is explained by giving an example of an LSI to be evaluated in the same manner as for the above immunity evaluation apparatuses to the conductive noises, and it is assumed that radiation noises are directly applied to the LSI.

Referring to FIG. 12, the immunity evaluation apparatus of this embodiment comprises a driver 51, a noise generator 52, a comparator 53, and a noise radiation section 54. The driver 51 applies an input pattern to each input terminal of the LSI 4 to be evaluated in order to check the operation of the LSI via a signal line. The noise generator 52 generates noise signals for immunity evaluation. The comparator 53, which is connected to an output terminal of the LSI 4 to be evaluated, compares an output pattern from the output terminal with an expected pattern 3 prepared in advance and then outputs the comparison result as a judgment result output. The noise radiation section 54 is a space covered with a metal or other shield structure, housing an antenna 54a for noise radiation and the LSI 4 to be evaluated so that the LSI 4 to be evaluated is exposed to a noise signal generated by the noise generator 52 as a radiation noise.

Next, an immunity evaluation method of this embodiment will be explained with reference to FIG. 13.

Figure 5:
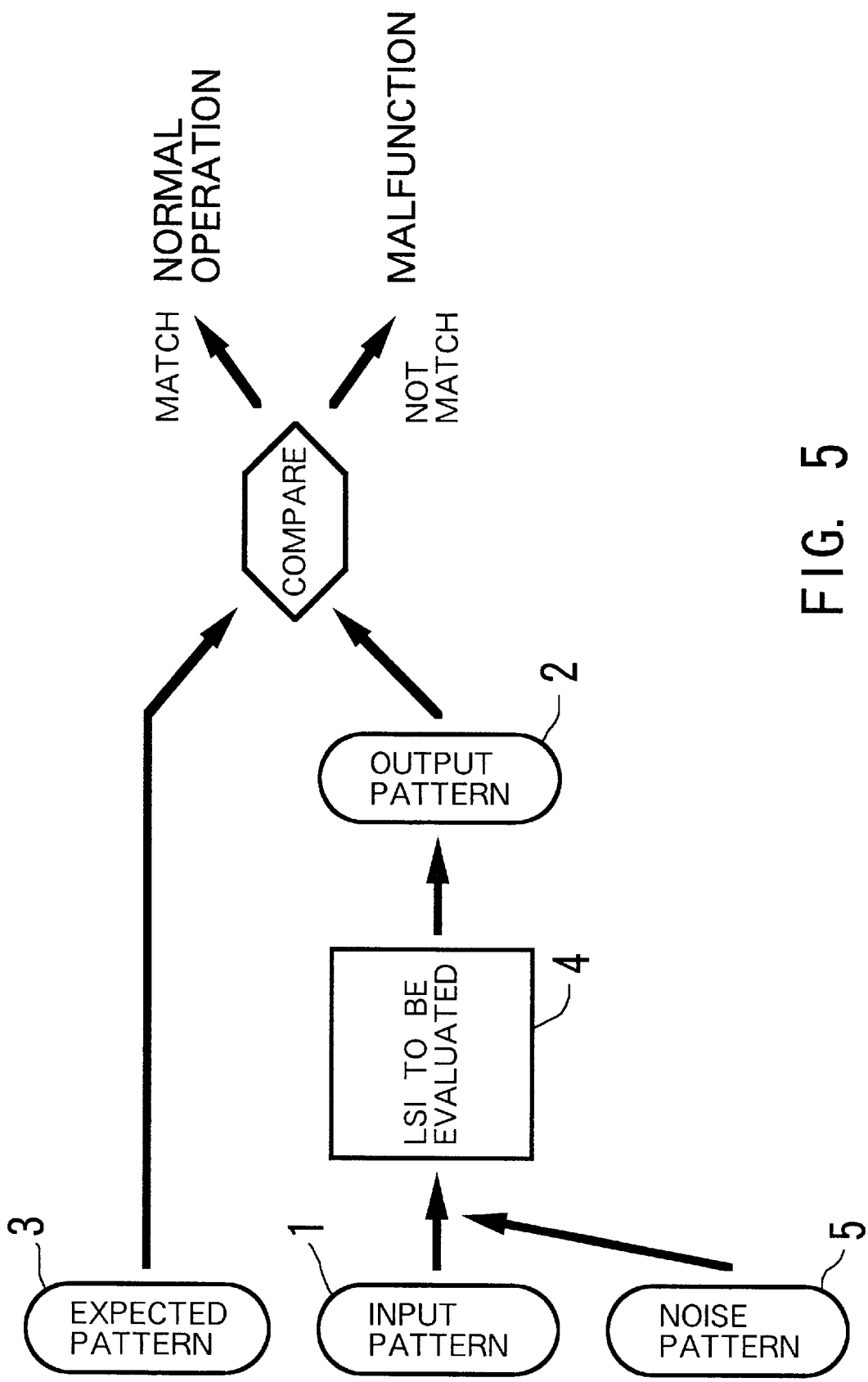
FIG. 5 is a diagram illustrating an immunity evaluation method in the immunity evaluation apparatus shown in FIG. 4.
Figure 13:
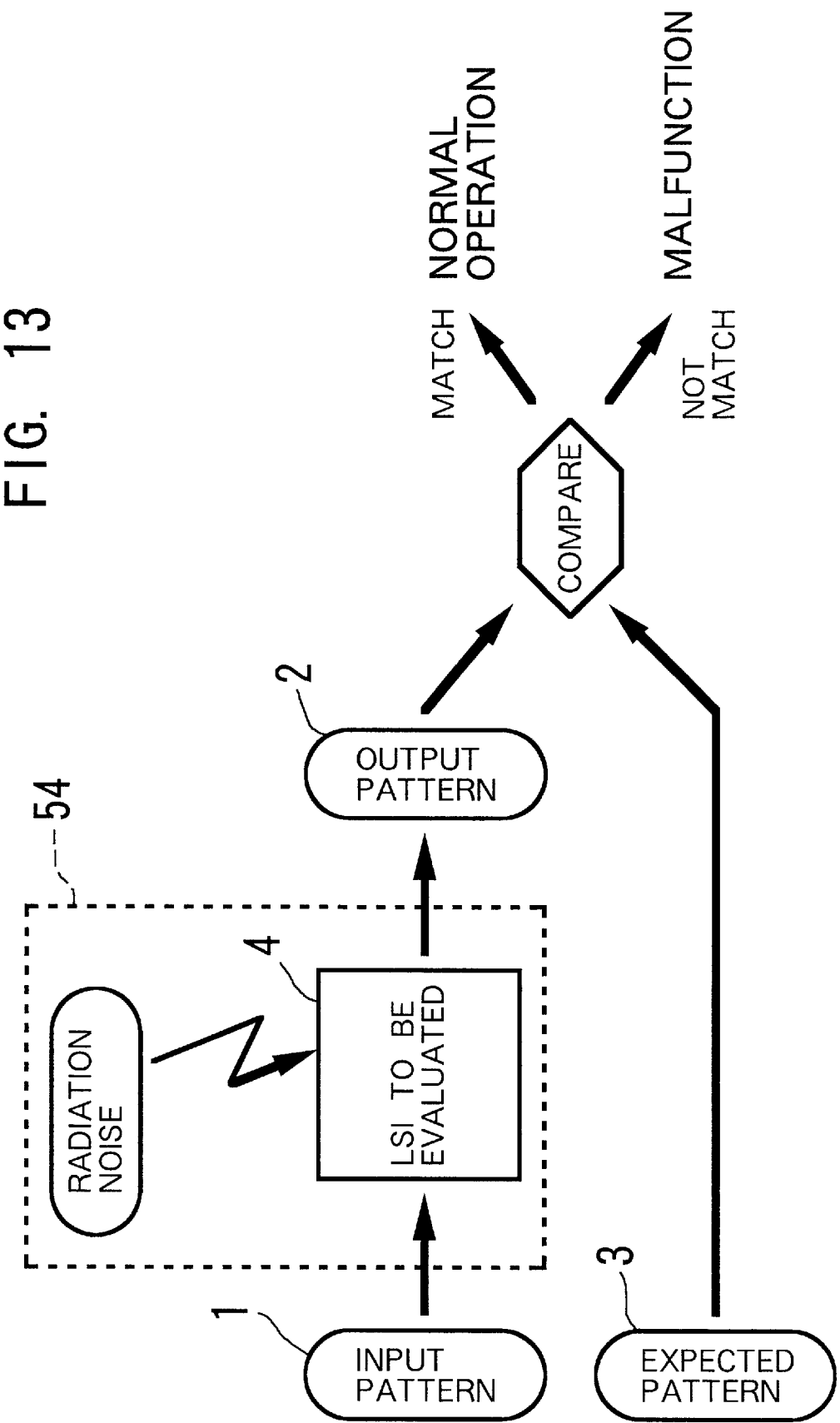
FIG. 13 is a diagram illustrating an immunity evaluation method in the immunity evaluation apparatus in FIG. 12.

FIG. 13, which is similar to FIG. 5, shows that an input pattern 1 is applied to an LSI 4 to be evaluated via a driver 51. At this point, the LSI 4 is exposed to the noise created based on the noise signal generated by the noise generator 52 as a radiation noise from the antenna 54a of the noise radiation section 54.

Afterward, an output pattern 2 obtained from the output terminal of the LSI 4 to be evaluated is compared with the expected pattern 3 by a comparator 53. As a comparison result, it is judged that the LSI 4 operation is normal if both patterns completely match and it is judged that the LSI 4 malfunctions if any of the patterns is different, and then the judgment result is output as a judgment result output. This operation sequence is assumed to be a cycle of a malfunction judgment. The above evaluation method is basically the same as one for the first embodiment of the present invention. While noise signals used for creating radiation noises have waveforms including various frequency components such as a continuous wave and a pulse wave, a noise is specified with the maximum peak value in any case.

Figure 14:
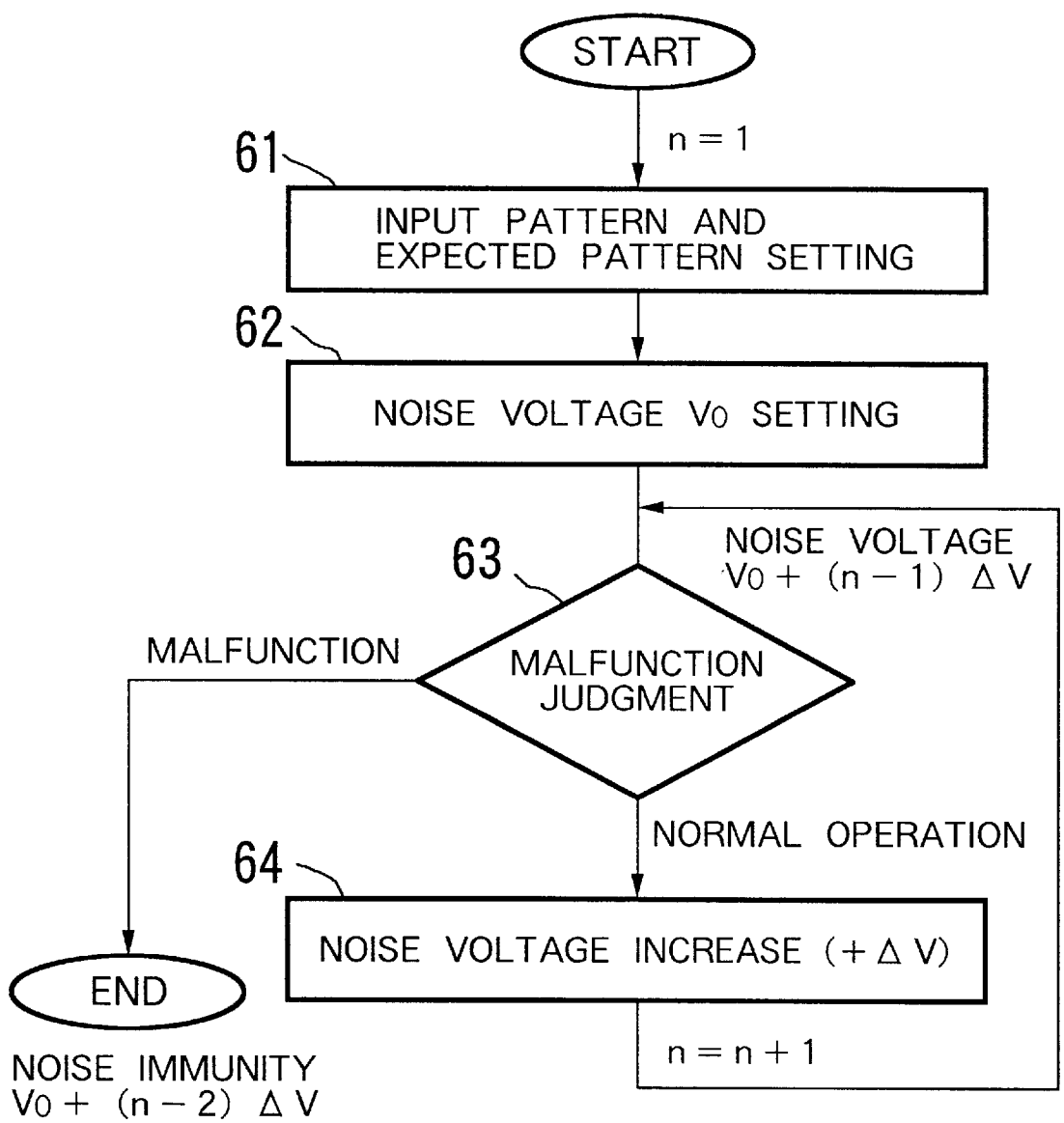
FIG. 14 is a flowchart illustrating an algorism of immunity evaluation made by the immunity evaluation apparatus in FIG. 12.

FIG. 14 shows a flowchart for an explanation of the noise immunity evaluation method.

First, the input pattern 1 and the expected pattern 3 are set (Step 61). Then, the normal input pattern 1 is applied via the driver 51 and an output pattern 2 from the LSI 4 to be evaluated is compared with the expected pattern 3 which has been prepared in advance by the comparator 52, by which it is confirmed that the LSI 4 normally operates. Next, a sufficiently low noise voltage $V_0[V]$ is generated in the noise generator 53 simultaneously with the generation of the input pattern 1, and then the LSI 4 to be evaluated is radiated with the noise voltage $V_0[v]$ from the noise radiation section 54. As a result, the entire LSI 4 is exposed to a radiation noise from the antenna 54a at the timing when an input signal of the input pattern 1 is entered. Whether or not the LSI malfunctions in this state is judged by using the comparator 52 in the same manner (Step 63). If the judgment result output indicates the normal operation, another operation judgment is made subsequently by using a noise voltage $(V_0+\Delta V[V])$ which has been increased by $\Delta V[V]$ in the same manner to radiate the LSI 4 with the noise voltage as a radiation noise at an input of the input pattern 1 (Step 63). This operation is repeated, and if malfunction occurs at an application of a noise voltage of $(n-1)\times\Delta V+V_0$ in the nth cycle (Step 63), $\{(n-2)\times\Delta V+V_0[V]\}$ is considered to be the maximum voltage at which the LSI 4 does not malfunction. Noise immunity to radiation noises is generally indicated by a field strength at which the LSI 4 to be evaluated is radiated with the noise voltage. The applied voltage is in proportion to the field strength in the evaluated LSI position. It is assumed that K designates their proportional coefficient, the noise immunity to radiation noises is expressed by $K\times\{(n-2)\times\Delta V+V_0\}[V/m]$. The proportional coefficient K is obtained by a previous measurement for each frequency by means of a field probe. If a TEM cell is used, an electric field in the TEM cell is theoretically calculated. It will be described later in detail.

In this embodiment, it is required to generate a radiation noise simultaneously with the generation of an input pattern. The simultaneous injection of the input pattern and the radiation noise, however, is not easy in this configuration only. Accordingly, by setting repeated application of the input pattern and applying the radiation noise arbitrarily in the middle of the repetition, it is easier to take timing, by which the repetition, it is easier to take timing, by which the immunity evaluation can be readily performed.

Figure 15:
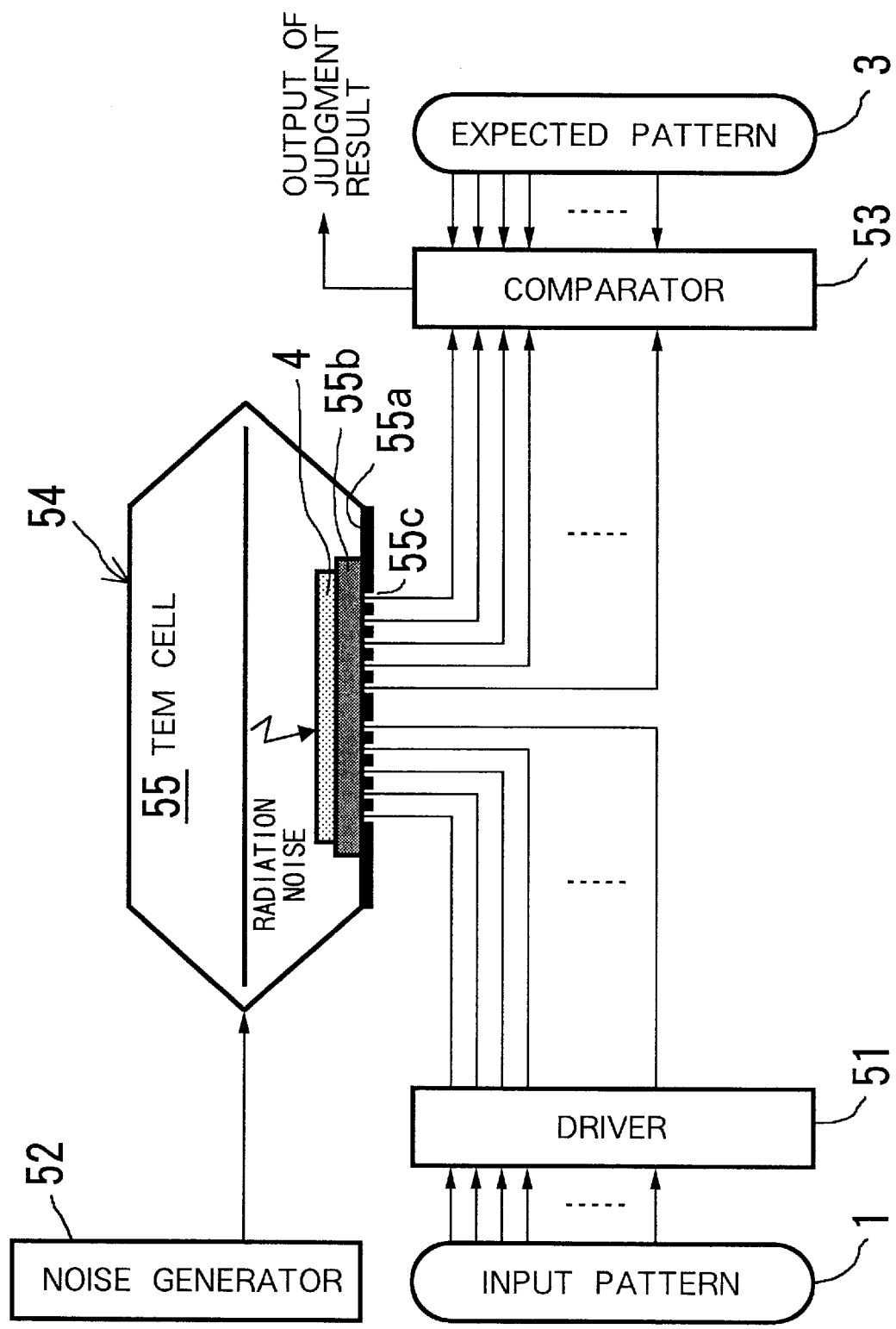
FIG. 15 is a block diagram illustrating a configuration of the immunity evaluation apparatus of a sixth embodiment of the present invention.

FIG. 15 illustrates a block diagram of an immunity evaluation apparatus of a sixth embodiment of the present invention, wherein the same reference numerals as for FIG. 12 designate corresponding components.

The immunity evaluation apparatus of this embodiment differs from the immunity evaluation apparatus of the fifth embodiment shown in FIG. 12 in that a noise radiation section 20 is replaced by a TEM cell 55. Other parts of the configuration are the same as those in FIG. 12, and therefore their explanation is omitted here.

The TEM cell 55 is an apparatus for generating electromagnetic waves in the TEM mode so that phases of an electric field and a magnetic field exist perpendicularly to a direction in which the electromagnetic wave travels (In FIG. 15, a noise generator is placed on the left of the TEM cell 55 and therefore an electromagnetic wave travels from the left to the right.) FIG. 15 shows a cross section of a horizontally viewed TEM cell. The electric field is generated between a central bulkhead and a base, while the magnetic field is generated in a lengthwise direction. A relatively uniform electric field is obtained in the middle of a gap between the base and a plane at a one-third height of a gap between the base and the bulkhead, and therefore preferably the LSI 4 to be evaluated is placed in the position. In this embodiment, the base is a printed circuit board 55a having a metal surface entirely exposed except terminal portions and is electrically in contact with other wall surfaces. The LSI 4 is mounted on a socket 55b on the printed circuit board 55a, so that it is placed at the preferable height set forth in the above. Therefore, the input-output terminals of the LSI 4 are guided to a back of the circuit board, that is, to the outside of the TEM cell 55 through the socket 55b and through via holes 55c.

The electric field E in the TEM cell 55 is expressed by the following formula:

$$E = V/B$$

where

E: Generated electric field [V/m]

B: Gap between central bulkhead and base [m]

V: Voltage observed at output terminal [V].

The TEM cell 55 is an almost uniform 50 Ω transmission line, and therefore it is necessary to use a noise generator having a 50 Ω output impedance. In some cases, a power meter or an isolator is placed between the noise generator and the TEM cell in order to observe a voltage at an output terminal or to protect the noise generator, which is considered as a general experimental environment in which the TEM is used.

The first advantage of using the TEM cell is that the LSI to be evaluated can be radiated with a wave in the TEM mode, that is, a plane wave in the same manner as for the conventional method in which a noise is applied to an LSI by using an antenna in an electromagnetic echoic chamber. It is an important element for standardization of measurements. The second advantage is that radiation noises exist only in the TEM cell 55 without any direct radiation with radiation noises on parts for evaluating the LSI 4 operation such as the driver 51 or the comparator 53 since the printed circuit board 55a on which the socket 55b is mounted forms a wall surface of the TEM cell 55. Therefore, these parts are prevented from malfunctioning by receiving radiation noises directly, which leads to reliable immunity evaluation.

This embodiment is the same as some embodiments set forth in the above in that malfunctioning is judged with a comparison between the output pattern 2 and the expected pattern 3 of an LSI 4 and that noise immunity is evaluated by increasing the noise voltage gradually.

Figure 16:
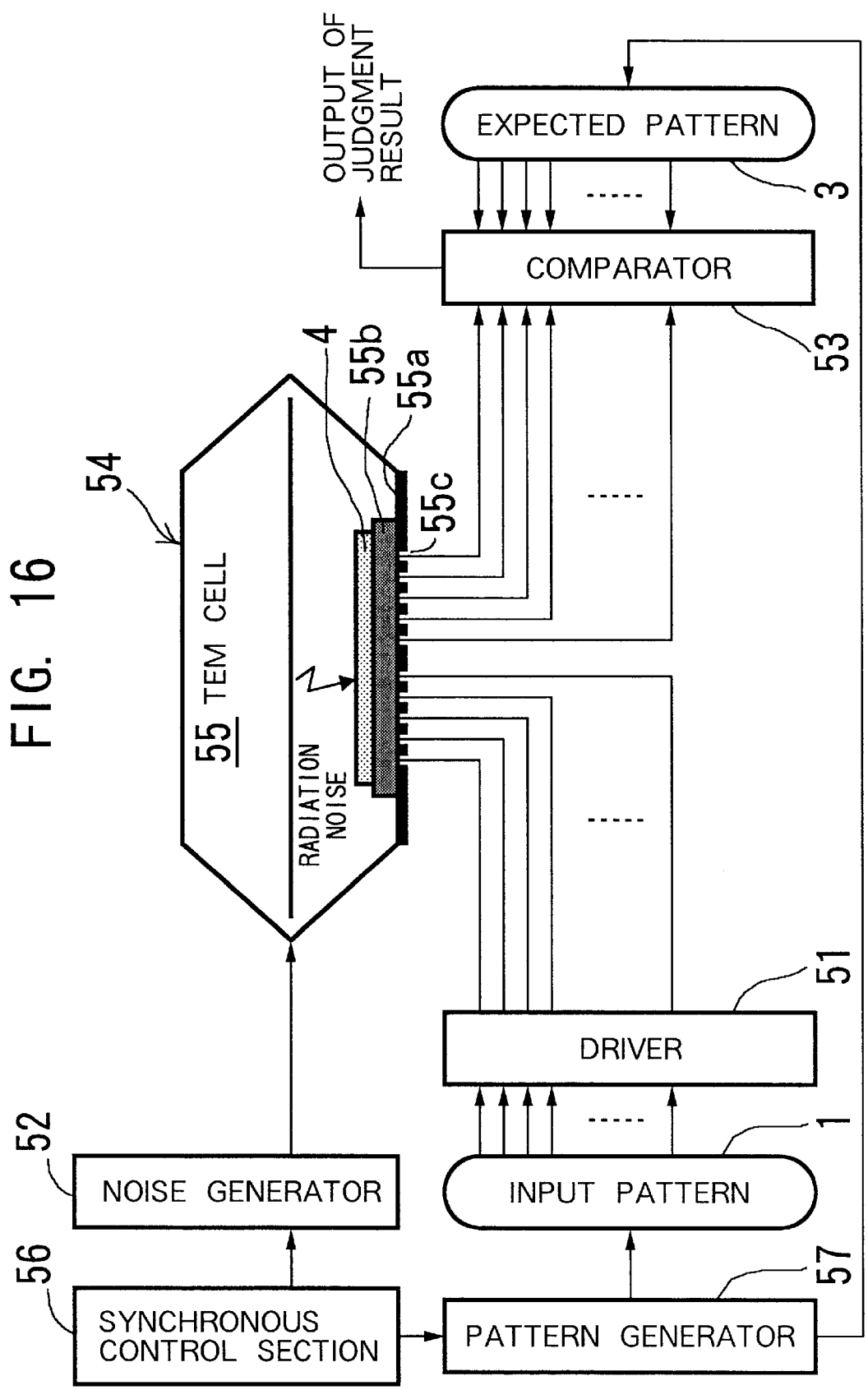
FIG. 16 is a block diagram illustrating a configuration of the immunity evaluation apparatus of a seventh embodiment of the present invention.

Referring to FIG. 16, there is shown a block diagram of an immunity evaluation apparatus to radiation noises of a seventh embodiment of the present invention, wherein the same reference numerals as for FIG. 15 designate corresponding components.

The immunity evaluation apparatus of this embodiment differs from the immunity evaluation apparatus of the embodiment shown in FIG. 15 in that a synchronous control section 56 is arranged in order to obtain an accurate timing of noise radiation. Particularly when a short radiation pulse waveform is applied, application timing cannot be successfully taken in some cases in the method of a noise application at arbitrary timing while applying an input pattern repeatedly to the LSI to be evaluated as set forth in the above. Accordingly, the synchronous control section is arranged as its countermeasure.

The synchronous control section 56 is connected to an input pattern generator 57 and a noise generator 52, by which an input pattern 1 can be combined with a noise pattern 5 at an arbitrary timing at their generation. Other parts of the configuration and the immunity evaluation method are the same as those in FIG. 15.

Figure 17:
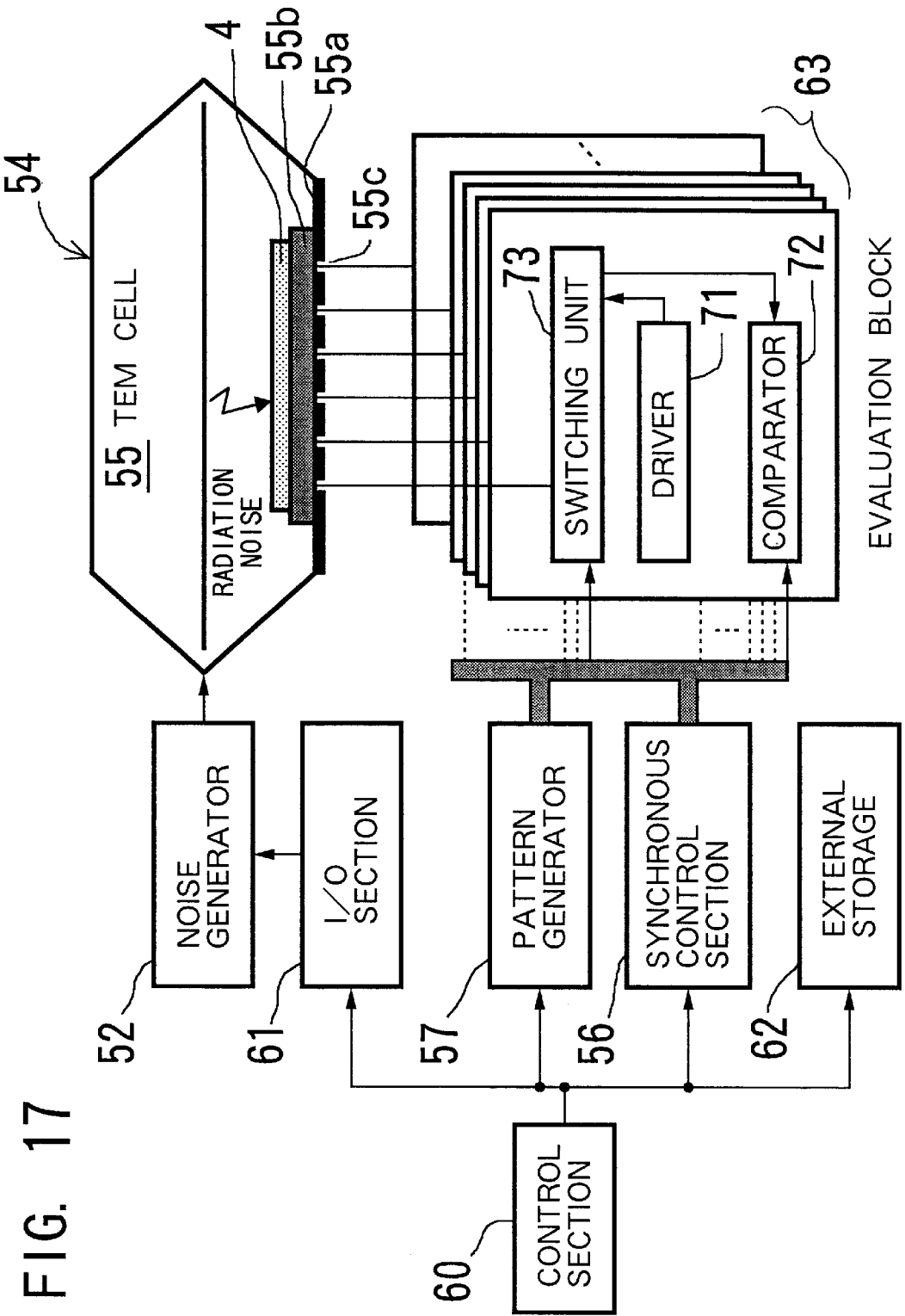
FIG. 17 is a block diagram illustrating a configuration of the LSI tester of an eighth embodiment of the present invention.

Referring to FIG. 17, there is shown a block diagram illustrating a configuration of an LSI tester of an eighth embodiment of the present invention intended for immunity evaluation to radiation noises. In this embodiment, the same reference numerals as for FIGS. 15 and 16 designate corresponding components.

This embodiment has a configuration of an LSI tester to which the noise immunity evaluation function of the embodiment shown in FIG. 16 is applied.

The LSI tester of this embodiment comprises a control section 60, an I/O section 61, a pattern generator 57, a synchronous control section 56, an external storage 62, a noise generator 52, a TEM cell 55 as a noise radiation section, and evaluation blocks 63 of the same number of terminals of the LSI to be evaluated.

The pattern generator 57 generates input patterns 1 and expected patterns 3, outputs the input patterns 1 to the driver 71, and outputs the expected patterns 3 to the comparator 72.

The synchronous control section 56 synchronizes the timing at which the input pattern is generated with the timing at which noise is applied by an order from the control section 60. The noise application timing is transmitted to the noise generator 52 via the I/O section 61, and the input pattern 1 generation timing is transmitted to the pattern generator 57.

Each evaluation block 63 comprises a driver 71, a comparator 72, and a switching unit 73. The driver 71 is a function for a terminal independently extracted from the functions of the driver 51 in FIG. 16, and its operation is the same as for the driver 51. The comparator 72 is a function for a terminal independently extracted from the functions of the comparator 53 in FIG. 16, and its operation is the same as for the comparator 53.

The switching unit 73 connects the driver 71 to the LSI 4 to be evaluated if the connected terminal of the LSI 4 functions as an input terminal and connects an output from the LSI 4 to the comparator 72 if it functions as an output terminal. The reason why the switching unit 73 is incorporated is the same as for the LSI tester to conductive noises shown in FIG. 11.

The external storage 62 indicates, for example, a hard disk or a floppy disk, containing a test program for testing LSIs and a program for actualizing a flowchart shown in FIG. 14 for the immunity evaluation.

Subsequently an operation of this embodiment will be explained below.

An operation of a normal LSI tester is explained first.

Following a normal test program stored in the external storage 62, in the pattern generator 57, an input pattern 1 and an expected pattern 3 are generated. The input pattern 1 is applied to the LSI 4 via the driver 71 and the switching unit 73. Then, an output pattern from the LSI 4 is entered into the comparator 72 via the switching unit 73. After that, the comparator 72 compares the output pattern with the expected pattern generated by the pattern generator 57 to evaluate the function.

Next, an operation of immunity evaluation is explained.

In the immunity evaluation, the noise generator 52 generates noise signals at the noise radiation timing transmitted by the synchronous control section 56 via the I/O section 61 in addition to the operation of the normal LSI tester. The generated noise signals are converted to radiation noises in the noise radiation section and then applied to the LSI 4 to be evaluated. Afterward, the output pattern is compared with the expected pattern 3 in the same method as for the normal LSI operation.

The noise immunity is evaluated by increasing an applied noise level gradually in the same method as one shown in the flowchart in FIG. 14. Programs for actualizing the flowchart in FIG. 14 are added as a program function used for a normal function evaluation, and all of them are stored in the external storage.

The components described in the all embodiments need not correspond to actual immunity evaluation apparatuses and a circuit configuration of an actual LSI tester individually, but respective components may be actualized in software.

Furthermore in the above embodiments, how to know the noise immunity level is explained in the LSI noise immunity evaluation methods, and these methods can be applied to a test method of judging whether or not an LSI has a certain noise immunity level. If immunity evaluation is intended for LSI product standards, these methods are effective.

As set forth hereinabove, the present invention has the following effects:

(1) According to an immunity evaluation apparatus of the present invention, it is possible to evaluate noise immunity characteristics to electromagnetic noises of an electronic circuit device or an electronic circuit component such as an LSI or a memory individually.

(2) According to an LSI tester of the present invention, a function test and noise immunity evaluation can be performed in an identical apparatus.

(3) According to an immunity evaluation apparatus and an LSI tester of the present invention, various electronic circuit devices or components can be submitted to noise immunity evaluation under the same conditions.

What is claimed is:

1. A method of evaluating noise immunity comprising generating an input pattern for checking an operation of an electronic circuit component to be evaluated and an expected pattern anticipated to be output for said input pattern if the electronic circuit component were operating normally; applying said input pattern to said electronic circuit component together with an electromagnetic noise; and comparing an output pattern obtained from said electronic circuit component with said expected pattern to check the operation of said electronic circuit component to the electromagnetic noise.

2. A method of evaluating noise immunity comprising:
generating an input pattern for checking an operation of an electronic circuit component to be evaluated and an expected pattern anticipated to be output for said input pattern if the electronic circuit component were operating normally;

applying said input pattern to said electronic circuit component together with an electromagnetic noise; and comparing an output pattern obtained from said electronic circuit component with said expected pattern to check the operation of said electronic circuit component to the electromagnetic noise;

wherein noise immunity of an electronic circuit component is assumed to be the maximum value of an electromagnetic level within a range of not causing any malfunction of the electronic circuit component when a level of an electromagnetic noise applied to the electronic circuit component to be evaluated is increased gradually or stepwise.

3. A noise immunity evaluation method according to claim 2, wherein noise immunity of an electronic circuit component is assumed to be a level which is onestep lower than a level at which the electronic circuit component has malfunctioned when a level of an electromagnetic noise applied to the electronic circuit component to be evaluated is increased stepwise.

4. A noise immunity evaluation method according to claim 1, wherein said electromagnetic noise is a conductive noise.

5. A noise immunity evaluation method according to claim 1, wherein said electromagnetic noise is a radiation noise.

6. A noise immunity evaluation apparatus for an electronic circuit component comprising:

a pattern generator for generating an input pattern used for checking an operation of the electronic circuit component to be evaluated and an expected pattern anticipated to be output for said input pattern if the electronic circuit component were operating normally;

a driver for entering said input pattern to said electronic circuit component via a signal line;

a noise generator for generating a noise for immunity evaluation;

a noise application section for applying the noise generated by the noise generator to said electronic circuit component; and a comparison means for comparing an output pattern obtained from said electronic circuit component with said expected pattern.

7. A noise immunity evaluation apparatus for an electronic circuit component comprising:

a pattern generator for generating an input pattern used for checking an operation of the electronic circuit component to be evaluated and an expected pattern anticipated to be output for said input pattern if the electronic circuit component were operating normally;

a driver for entering said input pattern to said electronic circuit component via a signal line;

a noise generator for generating a noise for immunity evaluation;

a noise application section for applying the noise generated by the noise generator to said electronic circuit component;

a comparison means for comparing an output pattern obtained from said electronic circuit component with said expected pattern; and a synchronous control section for synchronization between a pattern generation timing of said pattern generator and a noise generation timing of said noise generator.

8. A noise immunity evaluation apparatus for an electronic circuit component comprising:

a pattern generator for generating an input pattern used for checking an operation of the electronic circuit component to be evaluated and an expected pattern anticipated to be output for said input pattern if the electronic circuit component were operating normally;

a driver for entering said input pattern to said electronic circuit component via a signal line;

a noise generator for generating a noise for immunity evaluation;

a noise application section for applying the noise generated by the noise generator to at least one signal line between said driver and said electronic circuit component; and a comparison means for comparing an output pattern obtained from said electronic circuit component with said expected pattern.

9. A noise immunity evaluation apparatus for an electronic circuit component comprising:

a pattern generator for generating a input pattern used for checking an operation of the electronic circuit component to be evaluated and an expected pattern anticipated to be output for said input pattern if the electronic circuit component were operating normally;

a driver for entering said input pattern to said electronic circuit component via a signal line;

a noise generator for generating a noise for immunity evaluation;

a noise application section for applying the noise generated by the noise generator to at least one signal line between said driver and said electronic circuit component;

a comparison means for comparing an output pattern obtained from said electronic circuit component with said expected pattern; and a synchronous control section for synchronization between a pattern generation timing of said pattern generator and a noise generation timing of said noise generator.

10. A noise immunity evaluation apparatus for an electronic circuit component comprising:

a pattern generator for generating an input pattern used for checking an operation of the electronic circuit component to be evaluated and an expected pattern anticipated to be output for said input pattern if the electronic circuit component were operating normally operates;

a driver for entering said input pattern to said electronic circuit component via a signal line;

a noise generator for generating a noise for immunity evaluation;

a noise distributor for dividing the noise generated by the noise generator into a plurality of noises;

a noise application section for applying the plurality of noises divided by the noise distributor to a predetermined plurality of signal lines between said driver and said electronic circuit component; and a comparison means for comparing an output pattern obtained from said electronic circuit component with said expected pattern.

11. A noise immunity evaluation apparatus for an electronic circuit component comprising:

a pattern generator for generating an input pattern used for checking an operation of the electronic circuit component to be evaluated and an expected pattern anticipated to be output for said input pattern if the electronic circuit component were operating normally;

a noise generator for generating a noise for immunity evaluation;

a noise distributor for dividing the noise generated by the noise generator into a plurality of noises;

a synchronous control section for synchronization between an input pattern generation timing of said pattern generator and a noise generation timing of said noise generator; and a plurality of evaluation blocks each of which is connected to each terminal of said electronic circuit component via a signal line, wherein said each evaluation block comprises a driver for applying the input pattern from said pattern generator to the terminal of the electronic circuit component, a comparator for comparing an output pattern from the electronic circuit component with the expected pattern generated by said pattern generator, a noise application section for applying one of the plurality of noises divided by said noise distributor to said electronic circuit component via a signal line, and a switching unit for changeover between said driver and said comparator at the input pattern application and at the output pattern comparison.

12. A noise immunity evaluation apparatus for an electronic circuit component comprising:

pattern generator for generating an input pattern used for checking an operation of the electronic circuit component to be evaluated and an expected pattern anticipated to be output for said input pattern if the electronic circuit component were operating normally;

a driver for entering said input pattern to said electronic circuit component via a signal line;

a noise generator for generating a noise for immunity evaluation;

a noise radiation section for applying the noise generated by the noise generator to said electronic circuit component;

a comparison means for comparing an output pattern obtained from said electronic circuit component with said expected pattern; and further comprising a synchronous control section for synchronization between a pattern generation timing of said pattern generator and a noise generation timing of said noise generator.

* * * * *